US010419101B2

(12) United States Patent
Nast et al.

(10) Patent No.: US 10,419,101 B2
(45) Date of Patent: Sep. 17, 2019

(54) SIGNAL COUPLING APPARATUS AND METHOD OF OPERATING A SIGNAL COUPLING APPARATUS

(71) Applicant: LAIRD DABENDORF GMBH, Zossen (DE)

(72) Inventors: Helmut Nast, Berlin (DE); Raimo Jacobi, Berlin (DE); Ahmed Sayed, Berlin (DE)

(73) Assignee: Laird Dabendorf GmbH, Zossen (DE)

( * ) Notice: Subject to any disclaimer, the term of this patent is extended or adjusted under 35 U.S.C. 154(b) by 0 days.

(21) Appl. No.: 15/993,856

(22) Filed: May 31, 2018

(65) Prior Publication Data

US 2018/0351632 A1 Dec. 6, 2018

(30) Foreign Application Priority Data

May 31, 2017 (DE) .................. 10 2017 209 209

(51) Int. Cl.
*H04B 7/212* (2006.01)
*H04B 7/155* (2006.01)
(Continued)

(52) U.S. Cl.
CPC ........... *H04B 7/15528* (2013.01); *H03F 1/52* (2013.01); *H03F 3/19* (2013.01); *H04B 1/18* (2013.01);
(Continued)

(58) Field of Classification Search
CPC ...... H04B 1/0003; H04B 1/18; H04B 1/3877; H04B 7/15528; H04L 1/0003; H04L 1/0009; H04L 1/0015; H04L 25/03006; H04L 27/0012; H03F 1/52; H03F 2200/252; H03F 2200/417; H03F 2200/451; H03F 3/19
USPC ... 455/41.1, 41.2, 522, 13.2, 78, 126, 114.2, 455/25, 552.1, 115.1, 188.1; 370/140, 370/333, 352; 705/71; 343/861
See application file for complete search history.

(56) References Cited

U.S. PATENT DOCUMENTS

| 5,212,722 A | 5/1993 | Murata |
| 7,221,967 B2 * | 5/2007 | Van Buren ........... H04B 1/3877 455/127.3 |

(Continued)

FOREIGN PATENT DOCUMENTS

| DE | 4303110 A1 | 8/1994 |
| DE | 102013207898 A1 | 10/2014 |

(Continued)

*Primary Examiner* — Tan H Trinh
(74) *Attorney, Agent, or Firm* — Laurence A. Greenberg; Werner H. Stemer; Ralph E. Locher

(57) ABSTRACT

A signal coupling apparatus for transmitting transmission signals between a terminal and an antenna includes a terminal-side interface, at least one attenuation device and at least one connection signal arm for connecting the terminal-side interface with the attenuation device. At least a first transmission activity detection device is coupled with the connection signal arm for signaling purposes. The first transmission activity detection device is capable of generating a protection signal for controlling the attenuation device if a transmission power of a transmission signal is greater than a predetermined power. There is also described a method for operating such a signal coupling apparatus.

18 Claims, 6 Drawing Sheets

(51) Int. Cl.
*H04B 1/18* (2006.01)
*H04B 1/3877* (2015.01)
*H03F 1/52* (2006.01)
*H03F 3/19* (2006.01)

(52) U.S. Cl.
CPC ..... *H04B 1/3877* (2013.01); *H03F 2200/252* (2013.01); *H03F 2200/417* (2013.01); *H03F 2200/451* (2013.01)

(56) References Cited

U.S. PATENT DOCUMENTS

| | | | | |
|---|---|---|---|---|
| 8,872,720 B2 * | 10/2014 | Bae | ............... | H04B 1/0458 343/861 |
| 9,602,148 B2 * | 3/2017 | Nast | ............... | H03G 3/3042 |
| 10,084,505 B2 * | 9/2018 | Nast | ............... | H04L 5/14 |
| 10,211,793 B1 * | 2/2019 | Jacobi | ............... | H03F 3/193 |
| 2001/0027090 A1 * | 10/2001 | Uesugi | ............... | H03G 3/3042 455/126 |
| 2002/0111149 A1 * | 8/2002 | Shoki | ............... | H01Q 1/3275 455/277.1 |
| 2002/0141511 A1 * | 10/2002 | Vishakhadatta | ..... | H04B 1/0003 375/316 |
| 2003/0006839 A1 * | 1/2003 | Chominski | ............... | G01R 15/12 330/140 |
| 2007/0091873 A1 * | 4/2007 | LeBlanc | ............... | H04B 3/23 370/352 |
| 2007/0197170 A1 * | 8/2007 | Boos | ............... | H04B 1/406 455/78 |
| 2007/0281631 A1 * | 12/2007 | Nast | ............... | H04B 1/18 455/99 |
| 2008/0037507 A1 * | 2/2008 | Fukumoto | ............... | H04B 1/18 370/347 |
| 2008/0076358 A1 | 3/2008 | Van Buren et al. | | |
| 2008/0181369 A1 * | 7/2008 | Mugitani | ............... | H04M 1/24 379/1.03 |
| 2009/0081968 A1 * | 3/2009 | Vinayak | ............... | H03F 1/0222 455/110 |
| 2009/0232286 A1 * | 9/2009 | Hurwitz | ............... | H04M 11/062 379/93.01 |
| 2010/0045435 A1 * | 2/2010 | Duron | ............... | G06K 7/0008 340/10.1 |
| 2010/0069014 A1 * | 3/2010 | Haartsen | ............... | H04B 1/109 455/67.11 |
| 2011/0026426 A1 * | 2/2011 | Kirisawa | ............... | H03F 1/52 370/252 |
| 2011/0116422 A1 * | 5/2011 | Nast | ............... | H04B 1/3877 370/277 |
| 2013/0189923 A1 * | 7/2013 | Lewin | ............... | H04B 5/02 455/41.1 |
| 2013/0222076 A1 * | 8/2013 | Yi | ............... | G06K 7/0008 333/109 |
| 2015/0303904 A1 * | 10/2015 | Senaratne | ............... | H03G 3/3078 327/307 |
| 2016/0049969 A1 * | 2/2016 | Nast | ............... | H03G 3/3042 455/114.2 |
| 2016/0189146 A1 * | 6/2016 | Cattone | ............... | G06Q 20/3829 705/71 |
| 2016/0248459 A1 * | 8/2016 | Gan | ............... | H04B 1/109 |
| 2017/0214426 A1 * | 7/2017 | Nast | ............... | H04B 1/406 |
| 2017/0327084 A1 * | 11/2017 | Park | ............... | B60R 16/037 |
| 2018/0069929 A1 * | 3/2018 | Sabbaghian | ............... | H04L 67/12 |
| 2018/0106841 A1 * | 4/2018 | Lurz | ............... | G01R 23/145 |
| 2018/0123627 A1 * | 5/2018 | Myoung | ............... | H02J 50/12 |
| 2018/0167991 A1 * | 6/2018 | Bathich | ............... | H04B 1/006 |

FOREIGN PATENT DOCUMENTS

| | | |
|---|---|---|
| DE | 102014213933 A1 | 1/2016 |
| DE | 102014225022 A1 | 6/2016 |
| DE | 102015211278 A1 | 12/2016 |
| EP | 0410698 A2 | 3/1991 |
| WO | 2014177556 A1 | 11/2014 |
| WO | 2016008965 A1 | 1/2016 |

* cited by examiner

SIGNAL COUPLING APPARATUS AND METHOD OF OPERATING A SIGNAL COUPLING APPARATUS

CROSS-REFERENCE TO RELATED APPLICATION

This application claims the priority, under 35 U.S.C. § 119, of German patent application DE 10 2017 209 209.2, filed May 31, 2017; the prior application is herewith incorporated by reference in its entirety.

BACKGROUND OF THE INVENTION

Field of the Invention

The invention relates to a signal coupling apparatus and a method of operating a signal coupling apparatus.

From the prior art, signal coupling devices are known that are used for making a signal connection from a terminal, in particular a mobile telephone, to a terminal-external antenna. Signal coupling devices of this kind may be provided in particular in vehicles, in order to make a signal connection from a terminal inside a vehicle to a vehicle antenna. In this way, a high signal quality may be made available, while also reducing energy consumption when operating the terminal. Signal coupling devices of this kind may be designed in such a way that signals received from the terminal-external antenna and transmitted to the terminal, and/or signals transmitted from the terminal to the terminal-external antenna, may be processed and/or influenced, and in particular also amplified.

Our earlier patent application publication US 2017/0214426 A1 and its counterpart international publication WO 2016/008965 A1 describe a signal coupling device comprising at least one signal arm section that has or may have a signal connection to a terminal-side interface of the signal coupling device, the signal coupling device comprising at least one control and evaluation device, which may determine at least one property of a signal present on at least one signal arm section.

Our earlier U.S. Pat. No. 9,602,148 B2 and its counterpart international patent application publication WO 2014/177556 A1 disclose a circuit arrangement and a method for compensating signal attenuation in the transmission of transmission signals of a mobile device.

It is desirable to increase the operational reliability of the signal coupling apparatus, in particular by not applying undesirably large signal powers to parts of the signal coupling apparatus.

BRIEF SUMMARY OF THE INVENTION

It is accordingly an object of the invention to provide a signal coupling apparatus and a corresponding method, which overcome the above-mentioned and other disadvantages of the heretofore-known devices and methods of this general type and which provides for an apparatus and a method with increased reliability.

With the foregoing and other objects in view there is provided, in accordance with the invention, a signal coupling apparatus for transmitting transmission signals between a terminal and an antenna, the signal coupling apparatus comprising:
a terminal-side interface;
at least one attenuation device;
at least one connection signal arm for connecting the terminal-side interface with the attenuation device; and
a transmission activity detection device coupled to the at least one connection signal arm for signaling purposes, the transmission activity detection device generating a protection signal for controlling the attenuation device if at least one property of a signal that is present on the at least one connection signal arm deviates from a predetermined protection signal-specific property by more than a predetermined amount.

A signal coupling apparatus is proposed for transmitting transmission signals between a terminal and an antenna, in particular from the terminal to the antenna. "Antenna" here refers to an antenna external to the terminal. Transmission signals may in this case be transmitted in at least two transmission bands, but preferably more than two. In addition to transmitting transmission signals, the signal coupling apparatus may also be used for transmitting received signals from the antenna to the terminal. "Transmission band" here refers to a frequency band, such that a transmission signal transmitted in this transmission band has a frequency in the frequency band. Various transmission bands may be used to transmit signals, in particular transmission signals, according to various standards, for example a GSM standard, UMTS standard or LTE standard.

For example, signals may be transmitted in the transmission bands according to the GSM850, GSM900, GSM1800, or GSM1900 standard, or other standards. In addition, signals may be transmitted by a time division duplex method or a frequency division duplex method. However, this invention is not limited to the above-mentioned standards and methods; it relates to all methods currently known to a person of ordinary skill in the art, and also to future standards and methods.

The signal coupling apparatus comprises at least one terminal-side interface. "Terminal-side interface" here refers to an interface by means of which a signal connection may be established between the signal coupling apparatus and the terminal. This terminal-side interface may allow bidirectional signal transmission. The terminal-side interface may for example comprise a wireless coupler. The wireless coupler may comprise at least one coil for receiving transmission signals from the terminal.

This signal coupling apparatus may be arranged in a vehicle, in particular a motor vehicle. In this case, the terminal-external antenna may be a vehicle antenna in particular. In addition, the signal coupling apparatus may in particular be part of, or may comprise, a mobile communication amplification device.

For the purposes of this invention, a "connection" may refer to a signal connection. This may in particular be a galvanic and/or inductive and/or capacitive connection. Preferably, a connection is a galvanic connection. Parts of the signal coupling apparatus may preferably be connected by galvanic and inductive connections. The connection of the signal coupling apparatus to the terminal may, however, be an inductive or capacitive connection. For the purposes of this invention, the term "connection" also encompasses a signal coupling or a coupling as explained in greater detail below.

The signal coupling apparatus further comprises at least one attenuation device. A signal, in particular a signal level, may be attenuated, i.e. reduced, by the attenuation device. However, it is also possible that a signal level may be increased, i.e. amplified, by means of the attenuation device. The attenuation device may in this case perform a non-band-specific attenuation or amplification, in particular having the same attenuation or amplification factor for signals of all transmission bands. Thus, the attenuation device may also be referred to as a "broadband attenuation device."

The signal coupling apparatus further comprises a connection signal arm for connecting the terminal-side interface with the attenuation device. In particular, the terminal-side interface and the attenuation device may be galvanically connected to one another.

According to the invention, the signal coupling apparatus comprises at least a first transmission activity detection device. This device may also be referred to as a "transmit detector." The first transmission activity detection device may detect, in particular, whether a transmission signal generated by the terminal has been received by the signal coupling apparatus, in particular via the terminal-side interface. The first transmission activity detection device is coupled for signaling purposes to the connection signal arm. This coupling may take place in particular via a powercoupler. Alternatively, however, it is also possible to provide a galvanic connection between the connection signal arm and the first transmission activity detection device. In other words, by means of the first transmission activity detection device, a transmission activity of the terminal may be detectable based on the signal present on the connection signal arm.

In addition, a protection signal may be generated by means of the first transmission activity detection device if at least one property, in particular a signal level, of the signal present on the connection signal arm deviates from a predetermined protection signal-specific property by more than a predetermined amount. This may be determined for example by preliminary tests or simulations. Preferably, the protection signal may be generated when a transmission power of a transmission signal is greater than a predetermined protection signal power. In this way, a transmission power of a detected transmission signal may be determined by means of the transmission activity detection device. The property of the signal present on the connection signal arm may be determined based on a property of the signal that has been decoupled from the connection signal arm.

Also, a start signal for a transmission band-specific transmission activity detection may be generated by means of the first transmission activity detection device. This will be explained in greater detail below. In particular, a start signal for transmission activity detection specific to a transmission band may be generated when a property deviates from a predetermined start signal-specific property by more than a predetermined amount. Preferably, the start signal may be generated when the transmission power of the transmission signal is greater than a predetermined start signal power, the start signal power being less than the protection signal power.

The signal coupling apparatus may further comprise a control and evaluation device. This device may for example comprise, or be designed as, a microcontroller. In this case, the first transmission activity detection device may be connected to the control and evaluation device, in particular for transmitting the protection signal and for transmitting the above-described start signal.

In addition, if a protection signal has been generated, a protection function may be carried out by means of the signal coupling apparatus. The protection function may be carried out or controlled for example by the control and evaluation device. As explained in greater detail below, an attenuation factor of the attenuation device in particular may be varied. This variation may be controlled, for example, by the control and evaluation device. Preferably, however, the protection signal may also be transmitted directly from the first transmission activity detection device to the attenuation device, with the protection function, and in particular the varying of the attenuation factor, being carried out by the attenuation device.

Alternative protection functions may for example provide for opening or separating signal arms in the signal coupling apparatus in order to prevent the transmission of transmission signals having undesired properties.

This advantageously increases the reliability of the signal coupling apparatus. If a terminal sends a transmission signal with an undesired property, for example an undesirably high power, there is a risk of damage to parts of the signal coupling apparatus. Due to the coupling to the connection signal arm, a transmission signal of this kind may be detected rapidly, in particular immediately after reception by the signal coupling apparatus, via the first transmission activity detection device, and a protection function may in turn be initiated and carried out rapidly as a result. In particular, as a result, parts of the signal coupling apparatus are not exposed to a transmission signal with undesired properties, or are only exposed for a very short time.

In a preferred embodiment, the first transmission activity detection device is directly connected to the attenuation device. This direct connection may serve in particular to transmit the protection signal from the first transmission activity detection device to the attenuation device. A "direct connection" may refer to a connection between the first transmission activity detection device and the attenuation device, in which no additional signal processing devices are arranged.

As explained above, the protection signal may alternatively also be transmitted from the first transmission activity detection device to the control and evaluation device, the control and evaluation device then controlling an operation of the attenuation device based on the protection signal; in particular varying, and in particular increasing, an attenuation factor.

In the case of a direct connection, and in particular a galvanic connection, the attenuation device may vary, and in particular may increase, an attenuation factor immediately after receiving a protection signal.

This advantageously results in a rapid execution of the protection function, and thus in improved protection of the parts of the signal coupling apparatus.

In a further embodiment, the attenuation factor of the attenuation device may be varied if a protection signal has been generated. This and corresponding benefits were explained above.

This varying of an attenuation factor may also comprise deactivating the attenuation device; in this case, the device does not transmit any transmission signals.

In accordance with an added feature of the invention, the first transmission activity detection device is a device for non-transmission-band-specific transmission activity detection. This may mean, in particular, that the first transmission activity detection device is designed in such a way that a non-transmission-band-specific start signal may be generated by means of this device if a transmission signal is transmitted in at least one of a plurality of transmission bands. In this case, the start signal may be generated independently of which transmission band the transmission signal is transmitted in. Of course, the protection signal may also be generated by means of the non-transmission-band-specific transmission activity detection device if a transmission signal having a transmission power greater than the predetermined power is transmitted in at least one transmission band. In this case, the protection signal may also be generated independently of which transmission band the transmission signal is transmitted in.

This has the advantageous result that there is no need for a complicated separation of a transmission signal transmitted via the connection signal arm into band-specific portions. As a result, the space and cost needed for the first transmission activity detection device may advantageously be saved.

In a further embodiment, a combined transmission signal may be generated by means of the first transmission activity detection device, the combined transmission signal combining the components of the signal that were decoupled from the connection signal arm into at least two, and preferably all, transmission bands. Furthermore, the protection signal may be generated based on at least one property of the combined transmission signal. The start signal may also be generated based on at least one property of the combined transmission signal. In particular, the property may be a signal level.

This advantageously results in a transmission activity detection device that is easy to implement for generating a protection signal and if applicable a start signal.

In a further embodiment, the first transmission activity detection device comprises at least one signal separation means. In particular, the signal separation means may carry out a non-frequency-specific signal separation, wherein the (already separated) output signals of the signal separation means each have the same spectrum as the input signal (to be separated). The number of signals that have been separated may possibly correspond to the number of transmission bands.

The signal separation means may be configured in particular as a duplexer or as a splitter. The first transmission activity detection device further comprises at least one signal combining means. This means may also be designed as a splitter or duplexer. The signal combining means may also be referred to as a combiner. This advantageously yields the result that transmission band-specific portions of the transmission signal that have been decoupled from the connection signal arm may be separated out from this signal and then recombined. In this way, in particular, the influence of disturbances on the generation of the protection or start signal may be reduced. This in turn advantageously enables a more reliable and more robust generation of a protection signal or start signal.

In a further embodiment, the first transmission activity detection device comprises at least one signal filtering means. In particular, this may be designed and/or arranged such that a signal component which has been separated out is filtered. The signal filtering means may in this case be designed in such a way that a filtered signal only has frequencies in a predetermined frequency range, corresponding to the frequency range of a transmission band. In particular, the signal filtering means may be designed as a bandpass filter. In particular, each of the separated-out signals may be filtered by means of a transmission band-specific signal filtering means, with the separated-out and filtered signal having only frequencies in the transmission band-specific frequency range. Thus, the signal filtering means may also be referred to as a selection means.

The separated-out and filtered signal component may then in turn be combined with other signal components that are preferably also separated-out and filtered, by means of a signal combining means. This advantageously results in a further reduction of the influence of disturbances on the generation of protection or start signals.

In a further embodiment, the first transmission activity detection device comprises at least one signal level determination device of the signal that has been decoupled from the connection signal arm, or of a signal that is proportional to this signal level. In particular, a signal level of a combined transmission signal may be determined by means of this device. This advantageously results in a determination of a signal property that is reliable and easy to implement, and this determination in turn makes it possible to reliably generate a protection signal and a start signal.

In a further embodiment, the first transmission activity detection device comprises at least one comparator device. By means of the at least one comparator device, in particular, the signal level determined by the device for determining the signal level may be compared with a predetermined protection signal-specific threshold value. In addition, if the signal level is greater than the protection signal-specific threshold value, a protection signal may be generated by means of the comparator device.

In addition, by means of the comparator device or another comparator device, the signal level may be compared with a predetermined start signal-specific threshold value; and if the signal level is greater than this start signal-specific threshold value, a start signal may be generated. This start signal-specific threshold value may be less than the protection signal-specific threshold value.

In particular, a signal decoupled from the connection signal arm may be separated into transmission band-specific components, for example by means of the above-described signal separation means. These portions may then be filtered in turn, in particular by means of the signal filters. The filtered signal components may then in turn be combined, in particular by a signal combining means. A signal level of the combined signal may then be determined. Furthermore, this signal level may be compared with the above-described threshold values.

In a further embodiment, the signal coupling apparatus comprises an additional transmission activity detection device. This additional transmission activity detection device may be, in particular, a transmission band-specific transmission activity detection device. This may signify, in particular, that a band-specific transmission activity signal may be generated by means of the additional transmission activity detection device. The additional transmission activity detection device may also be referred to as an active transmission band identification device, when a transmission signal is transmitted in an active transmission band. A transmission band-specific transmission activity signal may thus be generated, in particular, if a transmission signal is transmitted in exactly the transmission band that is being inspected.

It is possible that a start signal for the additional transmission activity detection device may be generated via the first device. Thus, a transmission band-specific transmission activity detection may be started or initiated by means of the additional transmission activity detection device if the first transmission activity detection device has detected a non-transmission-band-specific transmission activity. In this case, it is possible that the devices for transmission activity detection may have a direct signal connection. Also, as above explained, the connection may be provided via the control and evaluation device. In particular, a non-transmission-band-specific start signal may be transmitted from the first transmission activity detection device to the control and evaluation device. Upon receipt of this start signal, this may control the additional transmission activity detection device in such a way that the transmission band-specific transmission activity detection, that is to say the identification of an active transmission band, is started or initiated.

By means of the additional transmission activity detection device, a transmission activity detection may preferably be carried out based on a property of a signal which is not present on the above-described connection signal arm but on a signal arm of the signal coupling apparatus that is different from this connection signal arm.

In a further embodiment, the signal coupling apparatus comprises a signal amplification device. This signal amplification device may in particular be a transmission band-specific signal amplification device. This may signify that the signal coupling apparatus may amplify the signals transmitted in different transmission bands differently, for example by comprising a signal amplification device for each transmission band, so that the transmission signal transmitted in one transmission band may be amplified by means of these amplification devices. In this case, amplification factors of the signal amplification device(s) may be adjusted, and in particular may be adjusted independently of one another. This signal amplification device is different from the attenuation device. It is possible in this case for the terminal-side interface to be connected to the amplifier device via the attenuation device.

In addition, an active transmission band may be detected or identified by means of the additional transmission activity detection device, based on the transmission signals amplified by the signal amplification device; a transmission signal being transmitted in the active transmission band.

In this case, the additional transmission activity detection device may be coupled for signaling purposes with the signal output connections of the signal amplification device(s). This coupling may take place, for example, via at least one or a plurality of power couplers.

In particular, for each transmission band, at least one property of the transmission signal transmitted in this transmission band may be determinable by means of the additional transmission activity detection device; the active transmission band then being detectable based on the signal properties. Again, the signal property may in particular be a signal level. In particular, an active transmission band may be detected if the property corresponds to a predetermined property, in particular if a signal level is greater than a predetermined threshold value.

Alternatively or in addition, an active transmission band may arise based on a comparison of the properties of the signals transmitted in the transmission bands. By way of example, the transmission band that has a signal level greater by more than a predetermined amount than the signal level of the signals in the other transmission bands may be detected as the active transmission band. This advantageously results in reliable transmission band-specific transmission activity detection.

It is possible that by means of the additional transmission activity detection device, an output signal may be generated based on the signal property, in particular the signal level, i.e. a magnitude proportional to the signal power of the transmission signal (transmission power), and that the active transmission band may be detected based on the output signal. The output signal may in particular be a voltage signal.

A relationship between the signal property and the output signal may be given in the form of a characteristic curve. By means of the characteristic curve, a signal property may be assigned, and in particular uniquely and unambiguously assigned, to an output signal.

In a further embodiment, the additional transmission activity detection device comprises at least a first switching device and a band-specific input signal arm for each transmission band. In addition, by means of the first switching device, a band-specific input signal arm selected from the group of input signal arms may be connected to an output signal arm of the first switching unit. In addition, a property of the transmission signal transmitted in a transmission band may be determined as a property of the signal present on the output signal arm of the additional transmission activity detection device, if the corresponding band-specific input signal arm is connected to the output signal arm. In this case, the band-specific input signal arms may be connected or coupled to the terminal-side interface, preferably to the output terminals of the band-specific amplifier device(s), so that a signal is transmitted via at least a section of the band-specific input signal arm, in particular via the section connected to the first switching device; the frequencies of the signal being in the corresponding transmission band and the signal being proportional or equal to the transmission signal, in particular the above-amplified transmission signal.

This yields the advantageous result in that separate devices for determining a signal property, in particular devices for determining a signal level, need not be provided for each transmission band. By this means, the space and manufacturing costs of the signal coupling apparatus may be reduced.

In a further embodiment, the additional transmission activity detection device comprises at least one signal combining device and at least one device for signal separation of the combined signal. The signal combining device may, for example, be in the form of a daisy-chain device, or may comprise such a device. The amplified signals in the individual transmission bands, or signals dependent thereon, may be combined by means of such a signal combining device. Furthermore, the device for signal separation may be a filter device, in particular a bandpass filter device. The signal components separated out by the device for signal separation may be transmitted, for example, via the band-specific input signal arms or a section thereof.

In this case, the filter device may be designed in such a way that a filtered signal only has frequencies from a predetermined frequency range, the frequency range corresponding to the frequency range of a transmission band. In particular, in each input signal arm, a transmission band-specific signal filtering means may be arranged that filters the signal transmitted via the input signal arm in such a way that the filtered signal only has frequencies from a transmission band-specific frequency range.

This advantageously results in reliable and accurate transmission band-specific transmission activity detection.

In accordance with yet a further feature of the invention, a further embodiment, the additional transmission activity detection device comprises an additional switching device, and a signal arm for transmitting the combined signal may be connected, by the additional switching device, to each band-specific input signal arm in the group of input signal arms of the first switching device. The above-described devices for signal separation, in particular the filter devices, may be arranged in the input signal arms of the first switching device.

The first and additional switching devices of the additional transmission activity detection device may then be operated synchronously with one another. This may mean that a first input signal arm is connected via the additional switching device to the signal arm for transmitting the combined signal; at the same time, this first input signal arm is connected to the described output signal arm by means of the first switching device.

The synchronous operation may be controlled by means of the control and evaluation device.

In addition, the additional transmission activity detection device may comprise an amplifier device for amplifying the combined signal. This amplifier device may be activated or deactivated. In particular, an operation of the amplifier device may be controlled by the control and evaluation device.

As a result, an extension of the characteristic curve may advantageously be achieved. If, as above explained, there is a relationship between the signal property and the output signal in the form of a characteristic, it may be possible that for certain value ranges of the signal property, for example for low values of the signal level, it will be impossible to generate a reliable and evaluable output signal. Due to the amplification, a low signal level may for example be amplified, which in turn causes the generation of a reliably evaluable output signal. In this case, the evaluation may take into account whether the amplifier device for amplifying the combined signal was activated or deactivated. With an activated amplifier device, for example, the output signal may be reduced by a predetermined amount, and in particular may be reduced by calculation, for or during the evaluation.

With the above and other objects in view there is also provided, in accordance with the invention, a method for operating a signal coupling apparatus for transmitting transmission signals between a terminal and an antenna, according to one of the embodiments described in this disclosure.

According to the invention, a protection signal may be generated by means of the first transmission activity detection device if at least one property of the signal present on the connection signal arm, in particular a signal level, deviates from a predetermined protection signal-specific property by more than a predetermined amount, for example if a transmission power of a transmission signal, i.e. a signal present on the connection signal arm, is greater than a predetermined protection signal-specific power. The predetermined protection signal-specific power may be determined experimentally, or based on properties of the parts of the signal coupling apparatus. In other words, the protection signal may be generated when a signal having undesired properties is transmitted in at least one transmission band.

Thus, the signal coupling apparatus is configured in such a way that a method according to one of the embodiments described in this disclosure may be implemented by means of the signal coupling apparatus.

In addition, by means of the first transmission activity detection device, a start signal may be generated if a signal property deviates from a predetermined start signal-specific property by more than a predetermined amount, for example, when the transmission power of the signal present on the connection signal arm is greater than a predetermined start signal-specific power. Thus, the start signal may be generated when a transmission signal is transmitted in at least one transmission band. This advantageously results in a rapid detection of transmission activity having undesirable properties. This in turn advantageously allows the rapid introduction of protection functions and thus increased reliability of the signal coupling apparatus.

In a further embodiment, a protection function is carried out when a protection signal has been generated. The protection function may, for example, prevent a transmission signal having undesired properties from being applied to parts of the signal coupling apparatus. For example, the power of the transmission signal may be attenuated when the protection signal has been generated. In addition, components of the transmission signal may be split. This advantageously results in increased reliability for the signal coupling apparatus.

In a preferred embodiment, an attenuation factor of the attenuation device is changed, and in particular increased, when a protection signal has been generated. The protection signal may be transmitted directly from the first transmission activity detection device to the attenuation device, with the attenuation device varying the attenuation factor after receiving the protection signal. Alternatively, it is also possible to transmit the protection signal to a control and evaluation device, with the control and evaluation device controlling the attenuation device in such a way as to vary the attenuation factor. This advantageously results in a rapid, simple implementation of the protection function.

In a further embodiment, a transmission activity detection is started by means of an additional transmission activity detection device, in particular a transmission band-specific transmission activity detection, when or after the first transmission activity detection device has detected a transmission activity, in particular a non-transmission-band-specific transmission activity. In other words, an active transmission band may be detected or identified when a transmission signal is transmitted in the active transmission band. In particular, a scanning process may be started, for example, with the above-described first and further switching devices synchronously controlled to detect an active input signal arm. During the scanning process, in particular each input signal arm of the first switching device may be connected to the output signal arm of the first switching device of the additional transmission activity detection device for a predetermined minimum time; in this case, an active transmission band is identified based on the properties of the signals present on the output signal arm.

In this case, the transmission activity detection may be carried out by means of the additional transmission activity detection device based on the transmission signals that have been amplified by a signal amplification device.

In addition, an amplification of a transmission band-specific or non-specific amplifier device in the transmission operation and/or the attenuation factor of the attenuation device may be adjusted based on a signal property, in particular a signal level, of the transmission signal amplified by the signal amplification device, and/or based on the identified active transmission band. In this case, a non-transmission-band-specific amplifier device amplifies the transmission signals transmitted in the respective individual transmission bands with the same amplification factor, while a transmission band-specific amplifier device amplifies the transmission signals transmitted in the individual transmission bands having respective amplification factors that may be adjusted independently of one another.

In addition, a nominal amplification of a transmission band-specific or non-specific amplifier device, and/or a nominal attenuation of the attenuation device, may be determined based on a signal property, in particular a signal level, of the transmission signal amplified by a (transmission band-specific) signal amplification device. This may also be referred to as calibration.

In addition, a measurement of the characteristic curve may also take place. This may also be referred to as calibration. In this case, a signal having a known transmission power may be transmitted, in particular in each transmission band. Furthermore, the output signal may then be determined, in particular as an output voltage, which—as explained above—is used for detecting the active transmission band. The transmission power, output signal associated with the known transmission power, and assignment to a transmission power, may then be stored, for example in a memory device. This memory device may be part of the control and evaluation device, or may have a data connection thereto. Based on this stored information, during operation of the signal coupling apparatus a transmission power may then be determined based on an output signal.

In addition, the transmission power may also be limited to a maximum permissible transmission power. The maximum permissible transmission power may be a transmission band-specific transmission power, i.e. in particular it may be different for different transmission bands. In particular, a deviation may be determined between the maximum permissible transmission power and the current transmission power, which is determined in particular based on the above-described output signal, for example by means of the control and evaluation device. The current transmission power may be determined, in particular, based on the output signal generated by the additional transmission activity detection device, i.e. in particular based on the transmission signal amplified by a signal amplification device. The maximum permissible transmission power may be a predetermined power.

In addition, the attenuation factor of the attenuation device may be varied, and in particular be increased, if the current transmission power is greater than, or greater by more than a predetermined amount than, the maximum permissible transmission power. In this case, the attenuation factor may be varied in such a way that the current transmission power is less than, or less by more than a predetermined amount than, or equal to, the maximum permissible transmission power.

However, it is also possible that a factor other than the attenuation factor, in particular an amplification factor of an amplifier device of the signal coupling apparatus, may be varied in such a way that the current transmission power is less than, or less by more than a predetermined amount than, or equal to, the maximum permissible transmission power.

In addition, the transmission power may also be limited to a desired transmission power. The desired transmission power may be a transmission band-specific transmission power, i.e. in particular it may be different for different transmission bands.

Information about a desired transmission power, in particular in the form of a power transmit bit, may in particular be transmitted from a base station to the terminal and/or to the signal coupling apparatus according to the invention, for example via the terminal. In this case, for example, the control and evaluation device may determine the desired transmission power based on the transmitted information.

In addition, in that case, a deviation may be determined, for example by means of the control and evaluation device, between the desired transmission power and the current transmission power, which is determined in particular based on the above-described output signal.

In addition, the attenuation factor of the attenuation device may be varied, and in particular may be increased or decreased, if the current transmission power deviates from the desired transmission power by more than a predetermined amount. In this case, the attenuation factor may be varied such that the current transmission power does not deviate from the desired transmission power, or does not deviate by more than a predetermined amount. However, it is also possible that factor other than the attenuation factor, in particular an amplification factor of an amplifier device of the signal coupling apparatus, may be varied in such a way that the current transmission power does not deviate from the desired transmission power, or does not deviate by more than a predetermined amount.

In particular, the desired transmission power may be a maximum desired transmission power. This may be different from, and in particular less than, the maximum permissible transmission power. In this case, the attenuation factor may be changed in such a way that the current transmission power is less than, or less by more than a predetermined amount than, or equal to, the desired transmission power. However, it is also possible that a factor other than the attenuation factor, in particular an amplification factor of an amplifier device of the signal coupling apparatus, may be varied in such a way that the current transmission power is less than, or less by more than a predetermined amount than, or equal to, the desired transmission power.

Other features which are considered as characteristic for the invention are set forth in the appended claims.

Although the invention is illustrated and described herein as embodied in a signal coupling apparatus and method of operating a signal coupling apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

In the following description and in the drawing, like reference numerals designate elements having like or similar technical features.

DETAILED DESCRIPTION OF THE INVENTION

Figure 1:
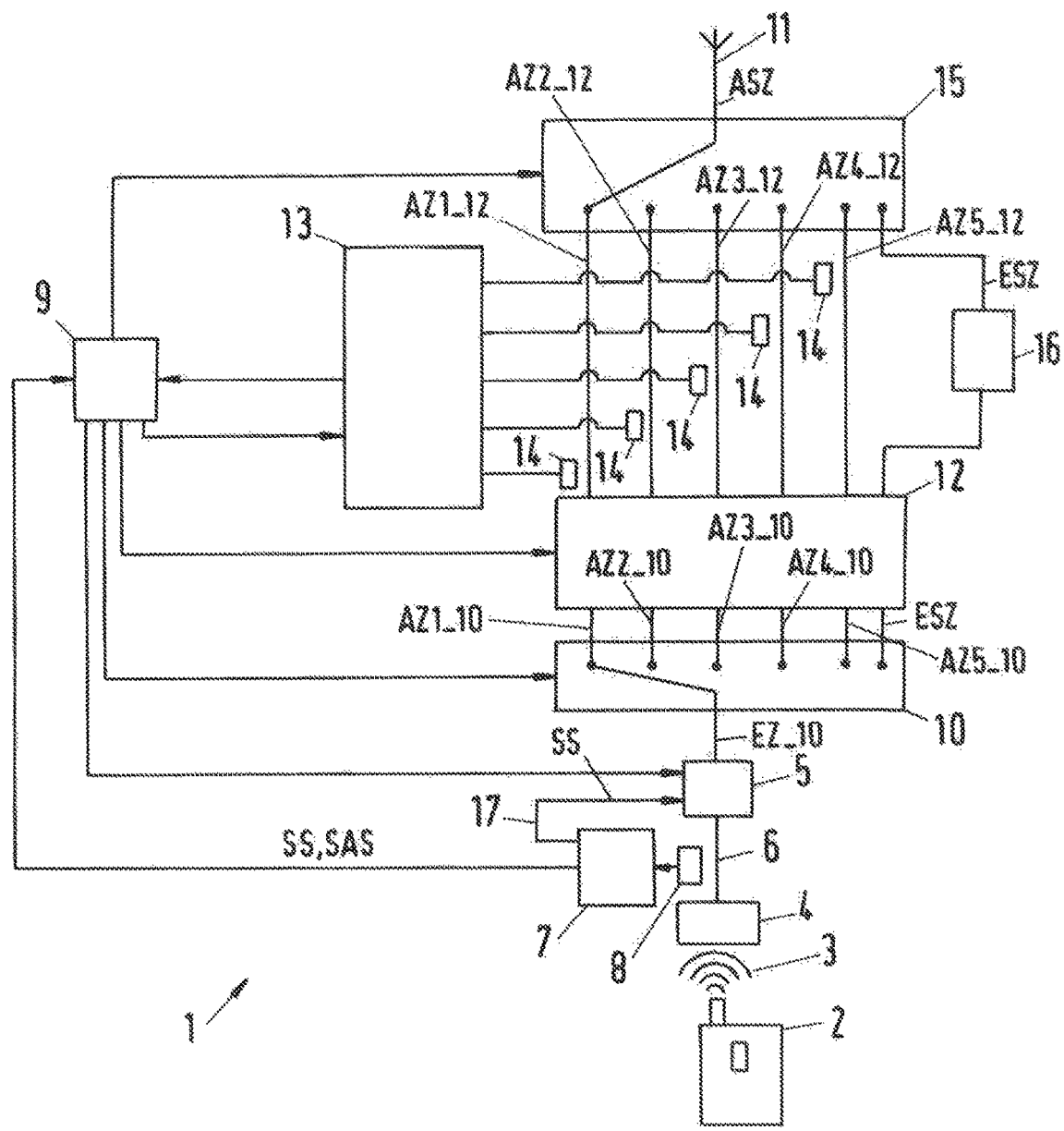
FIG. 1 shows a schematic circuit diagram of a signal coupling apparatus according to a first embodiment of the invention.

Referring now to the figures of the drawing in detail and first, particularly, to FIG. 1 thereof, there is shown a schematic circuit diagram of a signal coupling apparatus 1 according to the invention. A terminal 2 is shown, which may be for example a mobile telephone. A transmission signal 3 of the mobile telephone is depicted schematically.

The signal coupling apparatus 1 comprises a terminal-side interface 4, and the transmission signal 3 of the terminal 2 may be received by means of the terminal-side interface 4. This terminal-side interface 4 may comprise or form a wireless coupler. The signal coupling apparatus 1 further comprises an attenuation device 5. This device may preferably be an attenuation device 5 having an adjustable attenuation factor. The signal coupling apparatus 1 further comprises a connection signal arm 6 that connects the terminal-side interface with the attenuation device 5, in particular galvanically.

The signal coupling apparatus 1 further comprises a first transmission activity detection device 7. The signal coupling apparatus 1 further comprises a signal coupling device 8, and the first transmission activity detection device 7 is coupled for signaling purposes to the connection signal arm 6 via the signal coupling device 8, which may for example be designed as a power coupler. The first transmission activity detection device 7 has a direct galvanic signal connection to the attenuation device 5 via an additional connection signal arm 17. In addition, the first device 7 has a signal connection to a control and evaluation device 9. This device may be designed as, or may comprise, a microcontroller.

The signal coupling apparatus 1 further comprises a switching device 10, and a single input signal arm EZ_10 of the switching device 10 may be connected to five output signal arms AZ1_10, . . . , AZ5_10 of the switching device 10 or to a reception signal arm ESZ via the switching device 10. In the exemplary embodiment depicted in FIG. 1, the transmission of a transmission signal 3 from the terminal 2 to a terminal-external antenna 11 takes place in five frequency bands, which may also be referred to as transmission bands, and an output signal arm AZ1_10, . . . , AZ5_10 of the switching device 10 may be a transmission band-specific signal arm. However, this is only an example. Of course, the transmission may also take place in more, or less, than five transmission bands.

The signal coupling apparatus 1 further comprises an amplifier device 12. This device may amplify the signals present in the output signal arms AZ1_10, . . . , AZ5_10 of the switching device 10. In this case, the amplifier device 12 may amplify these signals in a manner that is either specific or non-specific to the signal arm. Thus, each of the signals transmitted in the five output signal arms AZ1_10, . . . , AZ5_10 of the switching device 10 may be amplified with different amplification factors, or with equal amplification factors.

The signal coupling apparatus further comprises an additional transmission activity detection device 13. This device has a signal connection to the output signal arms AZ1_12, . . . , AZ5_12 of the amplifier device 12 via the power coupler 14. By means of the additional transmission activity detection device 13, a transmission band-specific transmission activity detection may be performed. As a result, an active transmission band may be identified, that is to say a transmission band may be identified from the set of possible transmission bands, with the transmission signal 3 being transmitted in this active transmission band.

Also shown is an additional switching device 15 of the signal coupling apparatus 1, and each of the output signal arms AZ1_12, . . . , AZ5_12 of the first switching device 12, or the reception signal arm ESZ, may be connected to an antenna signal arm ASZ via the additional switching device 15. The control and evaluation device 9 may enable control of an operation of the switching devices 12, 15, an operation of the additional transmission activity detection device 7, and an operation of the attenuation device 5, as well as an operation of the amplifier device 12. For example, an attenuation factor of the attenuation device 5 may be adjustable by means of the control and evaluation device 9. One or a plurality of amplification factor(s) of the amplifier device 12 may also be adjustable by means of the control and evaluation device 9. However, this is not mandatory.

Also schematically shown is the reception signal arm ESZ; the antenna signal arm ASZ may also be connected with the reception signal arm ESZ, and the input signal arm EZ_10 of the first switching device 10 may be connected with the reception signal arm ESZ, via the first and additional switching devices 10, 15. This may in particular take place in a "transparent mode" in which no call data is transmitted. Also shown is an amplifier device 16 that is arranged in this reception signal arm ESZ and may amplify a reception signal that will be transmitted from the antenna 11 to the terminal 2. In addition, the amplifier device 12 is also arranged in the reception signal arm ESZ. In this case, the reception signal may also be amplified by the amplifier device 12.

Although not shown, the evaluation and control device 9 may also control the operation of this amplifier device 16 in the reception signal arm ESZ.

In FIG. 1 it is shown that the first transmission activity detection device 7 may have a direct, and in particular galvanic, connection to the attenuation device 5. A protection signal SS, which may be generated by the first transmission activity detection device 7, may be transmitted to the attenuation device 5 via this direct signal connection, which is made available by an additional connection signal arm 17.

Here, the protection signal SS may be generated by the first transmission activity detection device 7 when a property of the signal decoupled from the connection signal arm 6 deviates from a predetermined property by more than a predetermined amount, in particular if a transmission power of the signal decoupled from the connection signal arm 6 is greater than a predetermined protection signal-specific power. This may be determined by calibration or simulation.

In particular, by means of the first device 7, a signal level of the signal decoupled from the connection signal arm 6 may be determined and if the signal level of this signal is higher than a predetermined protection signal-specific level, the protection signal SS may be generated. If the attenuation device 5 receives the protection signal SS that has been generated by the first transmission activity detection device 7 and transmitted via the additional connection signal arm 17, the attenuation device 5 may vary, and in particular may increase, the attenuation factor.

Alternatively or in addition, it is possible for the generated protection signal SS to be transmitted from the first transmission activity detection device 7 to the control and evaluation device 9. In this case, the control and evaluation device 9 may control the execution of a protection function when the protection signal SS has been received. For example, the control and evaluation device 9 may vary, and in particular may increase, an attenuation factor of the attenuation device 5.

In this way, a transmission signal 3 that is transmitted from the terminal 2 with an undesired property, may be advantageously attenuated. This advantageously increases the operational reliability of the signal coupling apparatus 1, because signals having excessive power are not applied to parts such as the switching devices 10, 15 and amplifier device 12.

In addition, by means of the first transmission activity detection device 7, a start signal SAS may be generated if the property of the coupled signal deviates from a predetermined start signal-specific property by more than a predetermined amount, in particular if a transmission power of the signal decoupled from the connection signal arm 6 is greater than a predetermined start signal-specific power. This may be determined by calibration or simulation. This start signal SAS may be transmitted to the control and evaluation device 9. If the control and evaluation device 9 receives such a start signal SAS, a transmission activity detection, in particular the detection or identification of an active transmission band, may be started by means of the additional transmission activity detection device 13. For this purpose, the control and evaluation device 9 may control this additional transmission activity detection device 13.

In FIG. 1, the transmission activity detection, in particular the detection of an active transmission band, is performed by the additional transmission activity detection device 13 in response to amplified signals present on the output signal arms AZ1_12, . . . , AZ5_12 of the amplifier device 12. This has the advantageous result that in addition to detecting or identifying an active transmission band, it is possible to determine a transmission power of the amplified signals present on the output signal arms AZ1_12, . . . , AZ5_12. This transmission power corresponds substantially, or with only slight deviations, to the transmission power transmitted via the antenna 11, because the signal losses between the point at which signal power is determined and the antenna 11 are minimal. If a signal power determined in this way deviates from a desired signal power by more than a predetermined amount, the amplifier device 12 may be controlled, in particular by means of the control and evaluation device 9, in such a way that a desired signal power is achieved.

Figure 2:
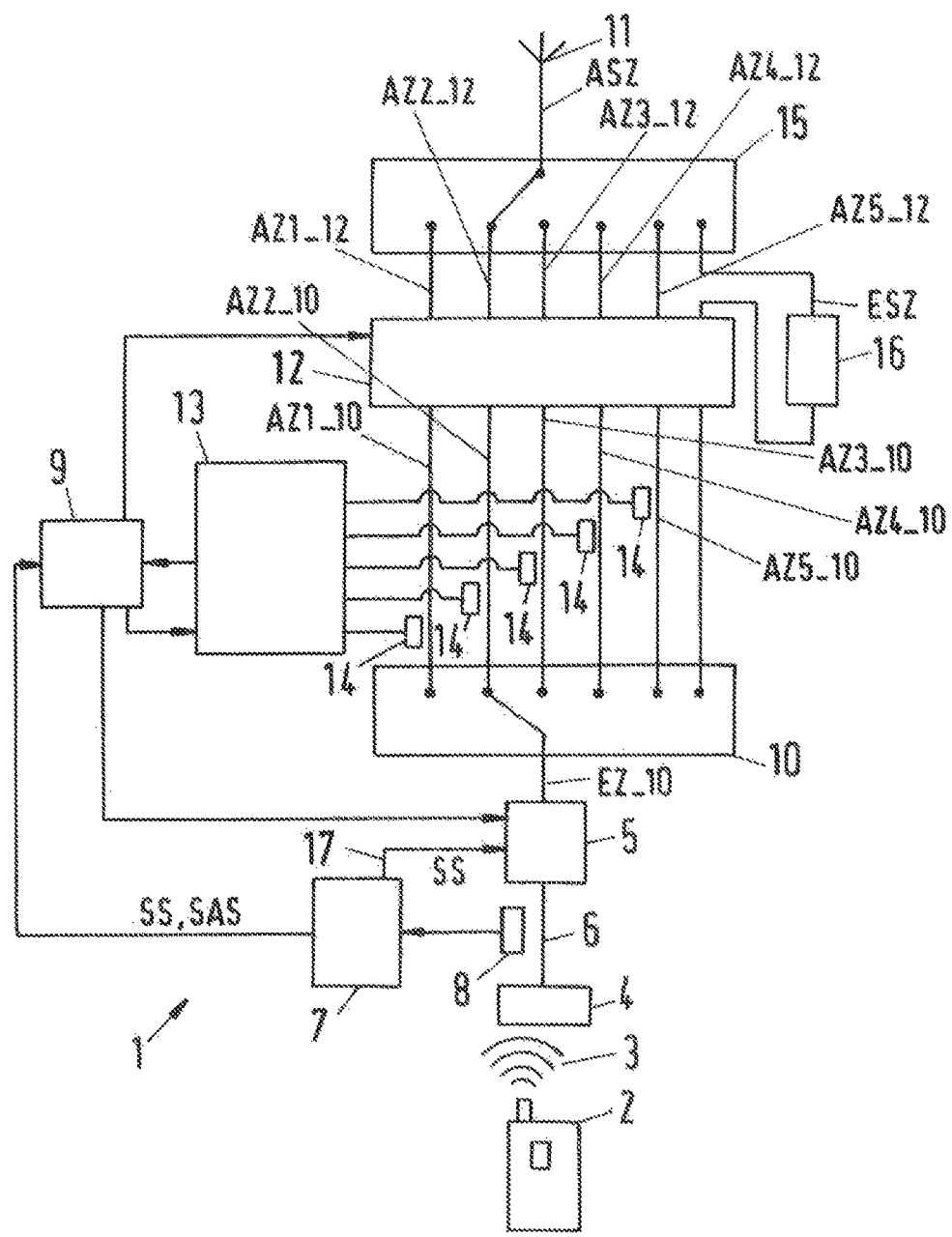
FIG. 2 shows a schematic circuit diagram of a signal coupling apparatus according to a further embodiment of the invention.

FIG. 2 shows a schematic circuit diagram of a further embodiment of a signal coupling apparatus 1. The signal coupling apparatus in the embodiment shown in FIG. 2 has substantially the same design as the signal coupling apparatus 1 depicted in FIG. 1. Therefore, reference should be made to the corresponding explanations for FIG. 1. But unlike the embodiment of the signal coupling apparatus 1 illustrated in FIG. 1 the transmission activity detection, and in particular the transmission band-specific transmission activity detection, is carried out by means of the additional transmission activity detection device 13 based on the unamplified signals present on the output signal arms AZ1_10, . . . , AZ5_10 of the first switching device 10.

Figure 3:
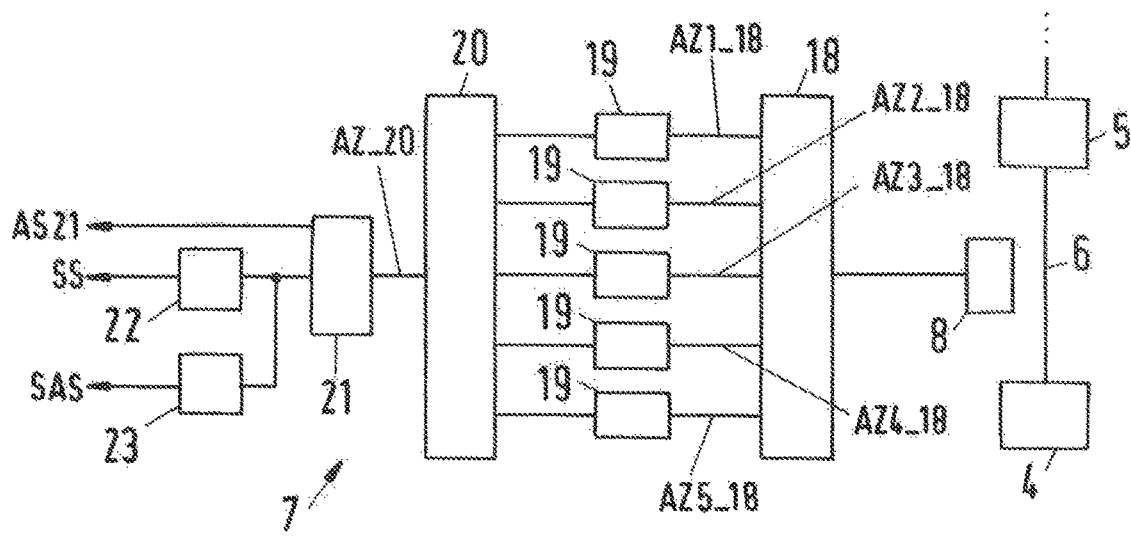
FIG. 3 shows a schematic circuit diagram of a first transmission activity detection device.

FIG. 3 shows a schematic circuit diagram of a first transmission activity detection device 7. Also shown are the terminal-side interface 4, the connection signal arm 6 and the attenuation device 5. Also shown is the signal coupling device 8, which is designed, for example, as a power coupler.

In this case, the first transmission activity detection device 7 may have a signal separation device 18. This device may comprise, for example, a splitter and/or a duplexer.

By means of the signal separation device 18, the signal decoupled from the connection signal arm 6 may be separated into transmission band-specific signal components. In particular, a signal component having frequencies in the first transmission band may be transmitted via a first output signal arm AZ1_18 of the signal separation device 18. Accordingly, signal components having frequencies in the additional transmission bands may be transmitted via additional output signal arms AZ2_18, AZ3_18, AZ4_18, AZ5_18.

The first transmission activity detection device 7 may further comprise filter devices 19. These devices may be designed in particular as bandpass filters. In this case, the filter devices 19 may filter the signals transmitted via the output signal arms AZ1_18, . . . , AZ5_18 of the signal separation device 18. The bandpass filter devices may in this case have cutoff frequencies that are adapted to the respective transmission bands. For example, signal components are filtered out of the transmitted signal, the frequencies of which are in the first transmission band, by means of the bandpass filter 19 in the first output signal arm AZ1_18.

As a result, it is possible to reduce interference effects on the decoupled signal, effects which could otherwise give rise to a faulty generation of a protection signal SS or start signal SAS.

The first transmission activity detection device 7 further comprises a signal combining device 20. By means of the signal combining device 20, the signal portions present on the output signal arms AZ1_18, . . . , AZ5_18 may be combined, and may be filtered by the filter device 19. The combined signal may then be transmitted to a signal level determination device 21 via an output signal arm AZ_20 of the signal combining device 20. The first transmission activity detection device 7 comprises this signal level determination device 21. This signal level determination device 21 may for example be designed as or comprise a rectifier.

The first transmission activity detection device 7 further comprises a first comparator device 22. The first comparator device 22 makes it possible to compare an output signal of the signal level determination device 21, which represents a signal level or is proportional to the signal level, to a predetermined protection signal-specific signal level. In this case, a protection signal SS is generated if the signal level is greater than predetermined protection signal-specific signal levels. By means of the additional comparator device 23, the output signal of the signal level determination device 21 may be compared with a predetermined start signal-specific signal level, a start signal SAS being generated when the output signal is greater than this start signal-specific signal level. The protection signal-specific signal level may be greater than the start signal-specific signal level. The drawing also shows that the output signal determined by the signal level determination device 21 may be transmitted, for example to the control and evaluation device 9 shown in FIG. 1.

Figure 4:
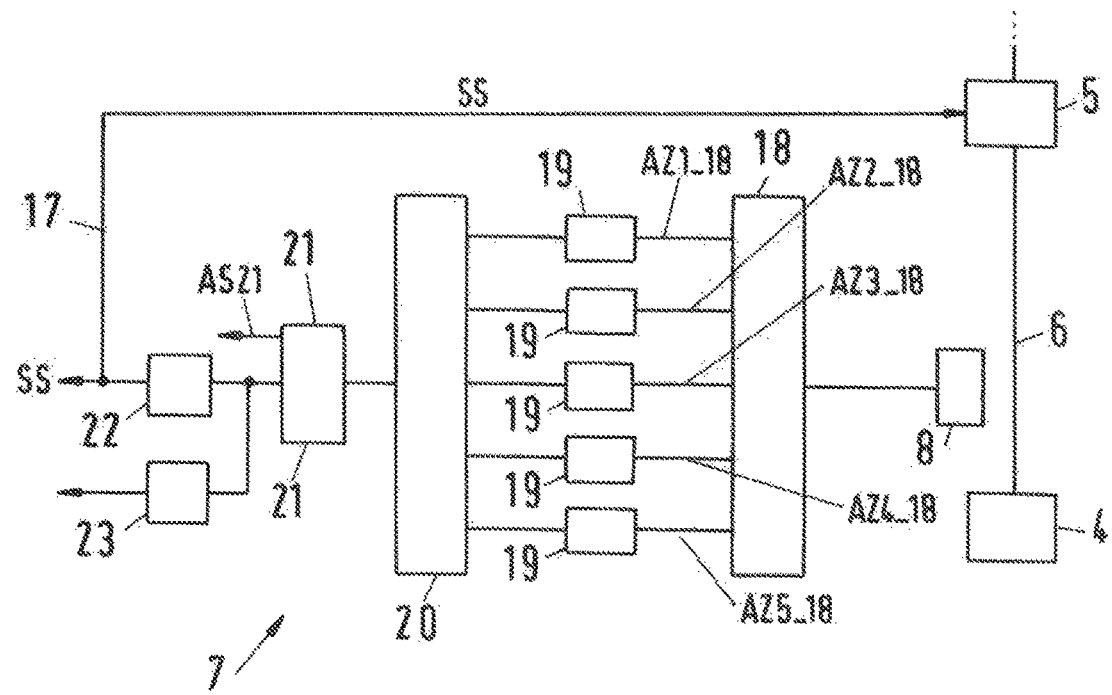
FIG. 4 shows a schematic circuit diagram of a first transmission activity detection device in a further embodiment.

FIG. 4 schematically depicts a circuit diagram of a first transmission activity detection device 7 in a further embodiment. The first transmission activity detection device 7 shown in FIG. 4 is designed substantially in the same way as the first transmission activity detection device 7 shown in FIG. 3. But in contrast to the embodiment shown in FIG. 3, the first device 7 has a direct galvanic signal connection to the attenuation device 5, via an additional connection signal arm 17. This protection signal SS may be transmitted via this additional connection signal arm 17.

Figure 5:
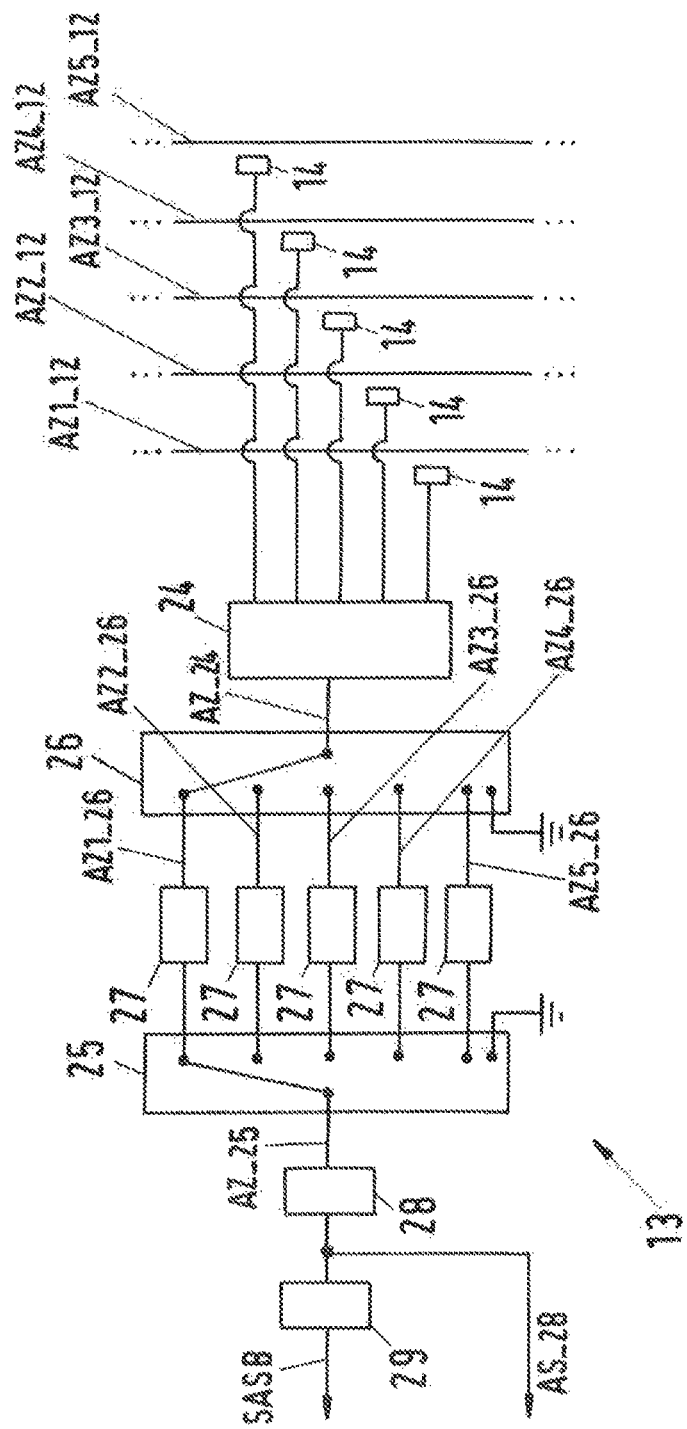
FIG. 5 shows a schematic circuit diagram of an additional transmission activity detection device in a further embodiment.

FIG. 5 shows a schematic circuit diagram of an additional transmission activity detection device 13. The additional transmission activity detection device 13 comprises a signal combining device 24. By means of this signal combining device 24, the signals may be combined that have been decoupled from the output signal arms AZ1_12, . . . , AZ5_12 of the signal amplification device 12 (see FIG. 1) via the signal coupling devices 14, which may also be designed as power couplers. This signal combining device 24 may include, for example, a splitter device and/or a duplexer device. The signal combining device 24 may also comprise, or be designed as, a daisy-chain device. This will be explained in greater detail below.

The additional transmission activity detection device 13 further comprises a first switching device 25 and an additional switching device 26. By means of the additional switching device 26, an output signal arm AZ_24 of the signal combining device 24 may be connected to exactly one output signal arm AZ1_26, AZ2_26, AZ3_26, AZ4_26, AZ5_26 of the additional switching device 26. By means of the first switching device 25, each of these output signal arms AZ1_26 . . . , AZ5_26 may be connected to an output signal arm AZ_25 of the first switching device 25. The additional transmission activity detection device 13 further comprises filter devices 27 that may be designed in particular as bandpass filter devices. As explained above with respect to the first transmission activity detection device 7, the bandpass filter devices may be designed in such a way that frequency components having frequencies in the respective transmission band may be filtered out of the respective output signal arm AZ1_26, . . . , AZ5_26 by means of the bandpass filter devices.

The additional device 13 further comprises a device 28 for determining a signal level of the signal adjacent to the output signal arm AZ_25 of the first switching device 25. The additional transmission activity detection device 13 further comprises a comparator device 29, wherein by means of the comparator device 29, an output signal of the signal level determination device 28, which output signal represents and is proportional to the signal level, may be compared to a predetermined signal level.

If the signal level is higher than the predetermined signal level, a transmission band-specific transmission activity signal SASB may be generated and transmitted via the comparator device 29, for example to the control and evaluation device 9. The control and evaluation device 9 then synchronously controls the switching states of the switching devices 26, 25 of the additional transmission activity detection device 13. If, for example, the first output signal arm AZ1_26 of the additional switching device 26 has a signal connection to the comparator device 29 via the switching devices 25, 26, a transmission activity in the first transmission band may be detected if the output signal of the device 28 is greater than the predetermined threshold value.

If, in this switching state, a transmission band-specific transmission activity signal SASB is then transmitted from the comparator device 29 to the control and evaluation device 9, this device may then detect that a transmission signal is being transmitted in the first transmission band. In this case, the first transmission band is identified as an active transmission band. In addition, an output signal AS_28 of the device 28 for determining a signal level may be transmitted to the control and evaluation device 9. Based on this output signal AS_28, the control and evaluation device 9 may determine a transmission power of the transmission signal transmitted in the first transmission band. If this is too high or too low, an amplification factor of the amplifier device 12 (see FIG. 1) may for example be changed, and in particular reduced or increased.

Figure 6:
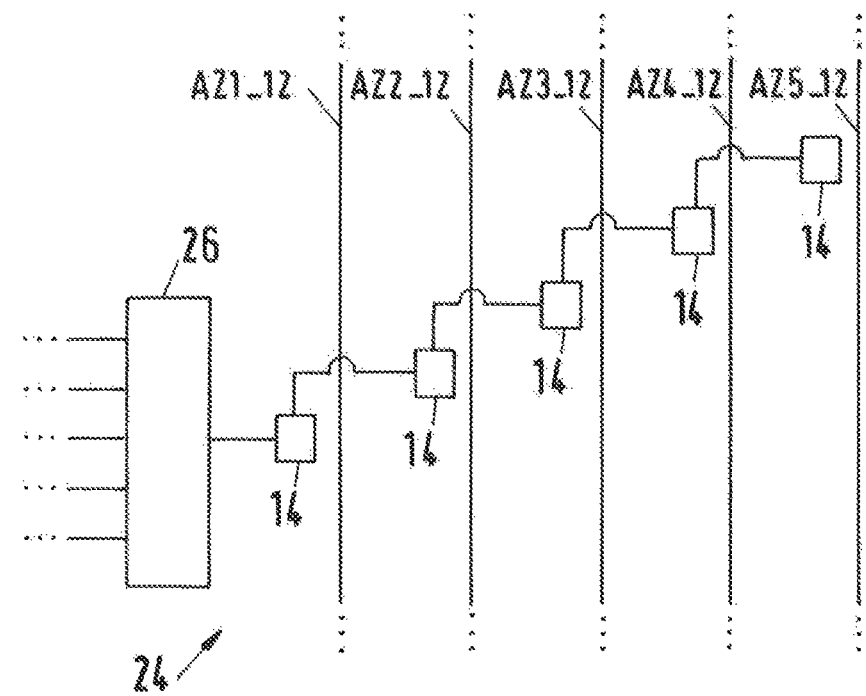
FIG. 6 shows a schematic circuit diagram of a signal combining.

FIG. 6 shows a schematic circuit diagram of a signal combining device 24 of the additional transmission activity detection device 13 (see FIG. 5). Shown are signal coupling devices, in particular signal coupling devices 14 that are designed as power couplers, which are interconnected in a daisy-chain arrangement. By means of this daisy-chain arrangement, a combining of the signals decoupled from the output signal arms AZ1_12, . . . , AZ5_12 is achieved.

Figure 7:
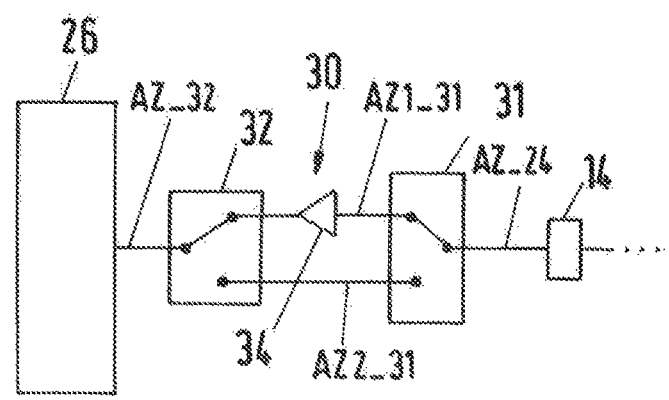
FIG. 7 shows a schematic circuit diagram of an activatable and deactivatable amplifier device.

FIG. 7 shows an activatable and deactivatable amplifier device circuit 30 that may be arranged, in particular for signaling purposes, between the signal combining device 24 (see FIG. 5) and the additional switching devices 26 of the additional transmission activity detection device 13. This amplifier device circuit 30 comprises a first switching device 31 and an additional switching device 32. By means of the first switching device 31, a signal present on the output signal arm AZ_24 of the signal combining device 24, i.e. a combined signal, may be connected to exactly one output signal arm AZ1_31, AZ2_31 of the first switching device 31. In the first output signal arm AZ1_31, an amplifier device 34 is arranged that has a constant or variable amplification factor and amplifies the signal on this output signal arm AZ1_30. No amplifier device is arranged in the additional output signal arm AZ2_31. By means of the additional switching device 32, exactly one of the output signal arms AZ1_31, AZ2_31 of the first switching device 31 may be connected to an output signal arm AZ_32 of the additional switching device 32. Thus, the combined signal may be amplified or not amplified by the amplifier device circuit 30.

Figure 8:
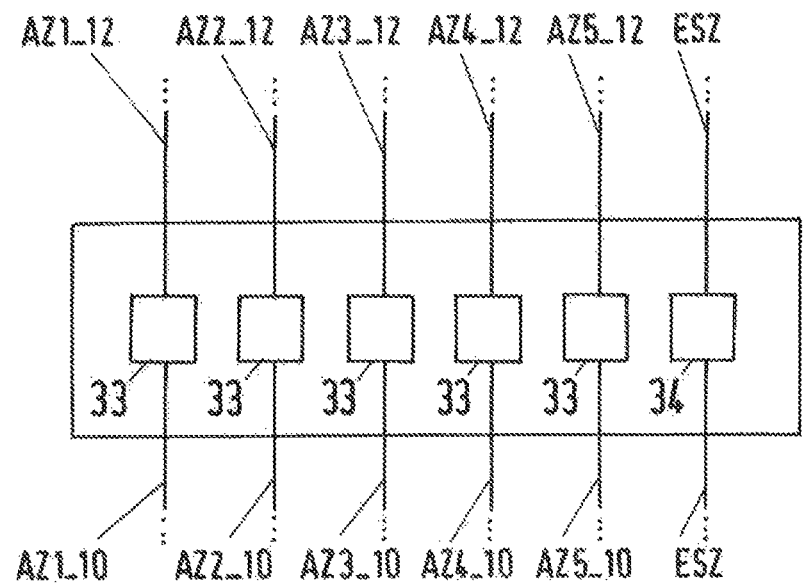
FIG. 8 shows a schematic circuit diagram of a transmission band-specific amplifier device.

FIG. 8 shows a schematic circuit diagram of the amplifier device 12 shown in FIG. 1. In particular, FIG. 8 presents a schematic circuit diagram of a transmission band-specific amplifier device 12. The transmission band-specific amplifier device 12 in particular comprises amplifier devices 33 for each of the five output signal arms AZ1_10, . . . , AZ5_10 of the first switching device 10, and an amplifier device 34 for the input signal arm ESZ. Because the amplifier device 12 may be controlled by the control and evaluation device 9 (see FIG. 1), signal arm-specific amplification factors in particular may be set.

Figure 9:
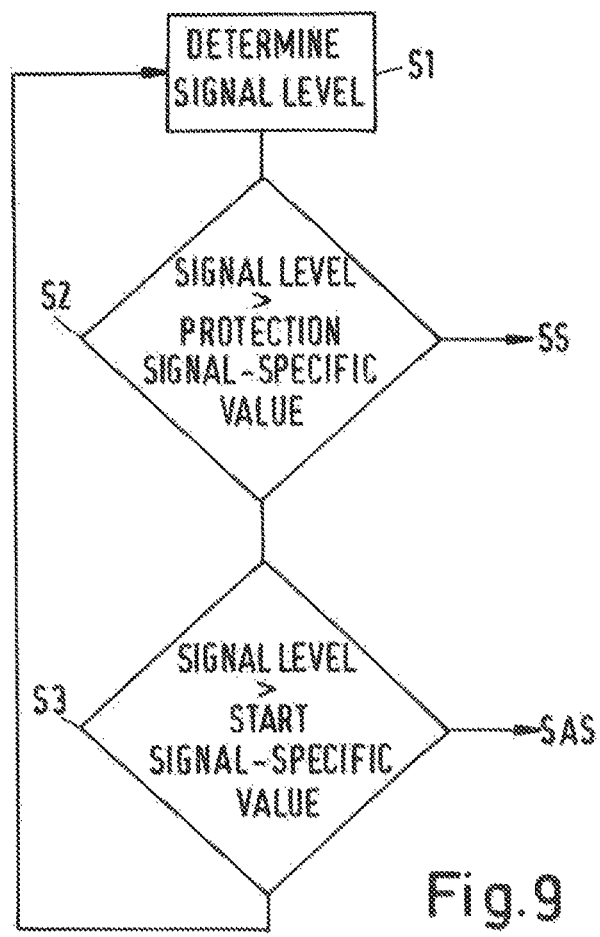
FIG. 9 shows a schematic flow diagram of a method according to the invention.

FIG. 9 presents a schematic flow diagram of a method according to the invention for operating a signal coupling apparatus 1 (see FIG. 1). In a first step S1, a property, in particular a level, of a signal decoupled from the connection signal arm 6 (see FIG. 1) is determined by means of the first transmission activity detection device 7. In a second step S2, the property is compared with a protection signal-specific property. If this property differs from a predetermined protection signal-specific property by more than a predetermined amount, a protection signal SS is generated. Otherwise, the property or an additional signal property, in particular again the signal level, is compared in a third step S3 with a start signal-specific property. If this property differs from a predetermined start signal-specific property by more than a predetermined amount, a start signal SAS is generated. If not, the method may return to the first step S1.

In the second step S2, the protection signal SS may in particular be generated when a signal level is greater than a protection signal-specific signal level. In the third step S3, the start signal SAS may be generated, in particular, when the signal level is greater than a start signal-specific signal level.

If a protection signal SS is generated, a protection function may be performed to protect the parts of the signal coupling apparatus prior to transmitting a transmission signal with undesired properties. If a start signal SAS is generated, the additional transmission activity detection device 13 may start the identification of an active transmission band.

The following is a summary list of reference numerals and the corresponding structure used in the above description of the invention:

1 Signal coupling apparatus
2 Terminal
3 Transmission signal
4 Terminal-side interface
5 Attenuation device
6 Connection signal arm
7 First transmission activity detection device
8 Signal coupling device
9 Control and evaluation device
10 First switching device
11 Antenna
12 Amplifier device
13 Additional transmission activity detection device
14 Signal coupling device
15 Additional switching device
16 Amplifier device
17 Additional connection signal arm
18 Signal separation device
19 Filter device
20 Signal combining device
21 Signal level determination device
22 First comparator device
23 Additional comparator device
24 Signal combining device
25 First switching device of additional transmission activity detection device
26 Additional switching device of additional transmission activity detection device
27 Filter device
28 Signal level determination device
29 Comparator device
30 Amplifier device circuit
31 First switching device
32 Additional switching device
33 Amplifier device
34 Amplifier device
SS Protection signal
SAS Start signal
EZ_10 Input signal arm of switching device
ESZ Reception signal arm
ASZ Antenna signal arm
AZ1_12, AZ5_12 Output signal arms of amplifier device
AZ1_10, AZ5_10 Output signal arms of first switching device 10
AZ1_18, AZ5_18 Output signal arms of signal combining device
AZ_20 Output signal arm of signal combining device
AS_21 Output signal of signal level determination device
AZ_24 Output signal arm of signal combining device
AZ_25 Output signal arm of first switching device
AZ1_26, AZ5_26 Output signal arm of additional switching device
SASB Transmission band-specific transmission activity signal
AS_28 Output signal of device 28 for determining a signal level
AZ1_31, AZ2_31 Output signal arms of first switching device 31
AZ_32 Output signal arm of additional switching device 32
S1 First step
S2 Second step
S3 Third step

The invention claimed is:

1. A signal coupling apparatus for transmitting transmission signals between a terminal and an antenna, the signal coupling apparatus comprising:
a terminal-side interface;
at least one attenuation device;
at least one connection signal arm for connecting said terminal-side interface with said attenuation device;
a transmission activity detection device coupled to said at least one connection signal arm for signaling purposes, said transmission activity detection device generating a protection signal for controlling said attenuation device if at least one property of a signal that is present on said at least one connection signal arm deviates from a predetermined protection signal-specific property by more than a predetermined amount;
a control and evaluation device, said transmission activity detection device including a direct galvanic signal connection to said attenuation device and to said control and evaluation device;
a switching device having output signal arms; and
an amplifier device to amplify signals present in said output signal arms of said switching device.

2. The signal coupling apparatus according to claim 1, wherein said transmission activity detection device is directly connected to said attenuation device.

3. The signal coupling apparatus according to claim 1, wherein an attenuation factor of said attenuation device may be varied if the protection signal has been generated.

4. The signal coupling apparatus according to claim 1, wherein said transmission activity detection device is a device for transmission band-specific transmission activity detection.

5. The signal coupling apparatus according to claim 1, wherein said transmission activity detection device is configured to generate a combined signal that combines portions of a signal decoupled from said connection signal arm that may be transmitted in at least two transmission bands, and the protection signal is generated based on at least one property of the combined signal.

6. The signal coupling apparatus according to claim 1, wherein said transmission activity detection device comprises at least one signal separation means and at least one signal combining means.

7. The signal coupling apparatus according to claim 1, wherein said transmission activity detection device comprises at least one signal filter.

8. The signal coupling apparatus according to claim 1, wherein said transmission activity detection device comprises at least one signal level determination device.

9. The signal coupling apparatus according to claim 1, wherein said transmission activity detection device comprises at least one comparator device.

10. The signal coupling apparatus according to claim 1, which further comprises an additional transmission activity detection device.

11. The signal coupling apparatus according to claim 10, which further comprises a signal amplification device, and wherein said additional transmission activity detection device is configured to detect an active transmission band based on a transmission signal amplified by said signal amplification device, when a transmission signal is transmitted in an active transmission band.

12. The signal coupling apparatus according to claim 10, wherein said additional transmission activity detection device comprises at least a first switching device and a band-specific input signal arm for each transmission band, wherein said first switching means is configured to connect a selected band-specific input signal arm with an output signal arm of said first switching device, wherein a property of the transmission signal transmitted in a transmission band is determined based on a property of the signal that is present on the output signal arm, if a corresponding band-specific input signal arm is connected to the output signal arm of said first switching device.

13. The signal coupling apparatus according to claim 10, wherein said additional transmission activity detection device comprises at least one signal combining device and at least one device for separating a combined signal.

14. The signal coupling apparatus according to claim 13, wherein sadi additional transmission activity detection device comprises an additional switching device, wherein a signal arm for transmitting the combined signal may be connected with each band-specific input signal arm of the first switching device by the additional switching device.

15. A method for operating a signal coupling apparatus for transmitting transmission signals between a terminal and an antenna, the method comprising:

providing a signal coupling apparatus according to claim 1;

generating a protection signal by the first transmission activity detection device when at least one property of a signal present on the connection signal arm deviates from a predetermined protection signal-specific property by more than a predetermined amount.

16. The method according to claim 15, which comprises carrying out a protection function when the protection signal has been generated.

17. The method according to claim 15, which comprises changing an attenuation factor of the attenuation device when the protection signal has been generated.

18. The method according to claim 15, which comprises starting a transmission activity detection with an additional transmission activity detection device, when a transmission activity has been detected by the transmission activity detection device.

* * * * *